United States Patent
Shi

(10) Patent No.: US 11,322,712 B2
(45) Date of Patent: May 3, 2022

(54) OLED DEVICE STRUCTURE WITH REDUCED VOLTAGE DROP AND MANUFACTURING METHOD THEREOF

(71) Applicant: Shenzhen China Star Optoelectronics Semiconductor Display Technology Co., Ltd., Guangdong (CN)

(72) Inventor: Longqiang Shi, Shenzhen (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 154 days.

(21) Appl. No.: 16/626,744

(22) PCT Filed: Dec. 23, 2019

(86) PCT No.: PCT/CN2019/127378
§ 371 (c)(1),
(2) Date: Dec. 26, 2019

(87) PCT Pub. No.: WO2021/109279
PCT Pub. Date: Jun. 10, 2021

(65) Prior Publication Data
US 2021/0336191 A1      Oct. 28, 2021

(30) Foreign Application Priority Data
Dec. 5, 2019   (CN) .......................... 201911236769.2

(51) Int. Cl.
*H01L 51/52*     (2006.01)
*H01L 51/56*     (2006.01)

(52) U.S. Cl.
CPC ...... *H01L 51/5228* (2013.01); *H01L 51/5209* (2013.01); *H01L 51/5237* (2013.01); *H01L 51/56* (2013.01)

(58) Field of Classification Search
None
See application file for complete search history.

(56) References Cited

U.S. PATENT DOCUMENTS

2014/0183502 A1*   7/2014   Song .................. H01L 51/5228
                                                                    257/40
2014/0312323 A1   10/2014   Park et al.
(Continued)

FOREIGN PATENT DOCUMENTS

CN          104124259 A       10/2014
CN          106206646 A       12/2016
(Continued)

*Primary Examiner* — Daniel Whalen
(74) *Attorney, Agent, or Firm* — Benesch, Friedlander, Coplan & Aronoff LLP

(57) ABSTRACT

An organic light-emitting diode (OLED) structure and a manufacturing method thereof are provided. The OLED structure includes a substrate, a metal layer, a passivation layer, an anode, and an OLED functional layer. By setting the OLED functional layer to form a PN junction with low impedance. The PN junction and a conductive layer with high impedance constitute a resistive divider, and the PN junction is turned on by adjusting a high-voltage direct current (DC) input source and a low-voltage DC input source. Because the resistance of the PN junction is very small, the potential of the cathode can be approximated to the potential of the low-voltage DC input source according to resistive voltage divider rule, and the low-voltage DC input source uses low-resistance metal, which can effectively avoid the problem of IR drop.

5 Claims, 6 Drawing Sheets

(56) References Cited

U.S. PATENT DOCUMENTS

| | | |
|---|---|---|
| 2017/0033166 A1* | 2/2017 | Shim .................. H01L 27/3279 |
| 2017/0077205 A1 | 3/2017 | Kim |
| 2017/0125725 A1 | 5/2017 | Paek et al. |
| 2018/0212007 A1 | 7/2018 | Lee et al. |
| 2018/0212008 A1 | 7/2018 | Tang |
| 2019/0067396 A1 | 2/2019 | Cheng et al. |

FOREIGN PATENT DOCUMENTS

| | | |
|---|---|---|
| CN | 106654048 A | 5/2017 |
| CN | 107039486 A | 8/2017 |
| CN | 108336107 A | 7/2018 |
| CN | 111063813 A | 4/2020 |
| KR | 20150002422 A | 1/2015 |

* cited by examiner

OLED DEVICE STRUCTURE WITH REDUCED VOLTAGE DROP AND MANUFACTURING METHOD THEREOF

FIELD OF INVENTION

The present disclosure relates to the field of display technologies, and in particular, to an organic light-emitting diode (OLED) device structure and a method for manufacturing the same.

BACKGROUND OF INVENTION

In recent years, organic light-emitting diodes (OLEDs) have become very popular emerging flat display products at home and abroad. This is because OLED displays have characteristics of self-luminous, wide viewing angles, fast response times, high luminous efficiency, wide color gamut, low driving voltage, thin panel, large-sized and flexible panels can be made, and simple manufacturing process, and have the potential of low cost.

As shown in FIG. 1, where FIG. 1 is a pixel circuit diagram of an active matrix organic light-emitting diode (AMOLED) display device. It is the most common 2T1C structure, and it consists of two N-type thin film transistors and a storage capacitor. The 2T1C structure pixel circuit converts voltage into an electric current that drives an organic light-emitting diode to emit light. Top emission OLED is the future development direction of the AMOLED due to larger aperture ratio and high resolution. The biggest disadvantage of the 2T1C structure is the problem of voltage drop (IR drop). The reason is that a cathode must be made of very thin magnesium (Mg) and silver (Ag) alloys, otherwise it will affect the transmittance. But the thin cathode has high resistance, so the IR drop effect is obvious.

In the conventional art, those skilled in the art usually add an auxiliary cathode (VSS) in the design to solve the abovementioned problems.

As shown in FIG. 2, where a passivation layer 112 is patterned on an upper surface of a low-voltage direct current (DC) input source 111. A first through hole 113a and a second through hole 113b are disposed in the passivation layer 112. An anode 114 completely fills the first through hole 113a and the second through hole 113b, and extends to a surface of the passivation layer 112. An electron transport layer 115 (ETL) is disposed on the surface of the passivation layer 112 corresponding to the first through hole 113a, and a cathode 116 is disposed on the anode 114 and an upper surface of the electron transport layer 115. The low-voltage DC input source 111 uses a low-impedance metal trace, and is in contact with the cathode 116 through the through hole 113. In the manufacturing process, the electron transport material is evaporated on an entire surface of the display area, therefore, the electron transport layer is disposed on an upper surface of the anode (ITO) inside a pixel.

As shown in FIG. 3, where FIG. 3 is an equivalent circuit diagram of FIG. 2. According to the schematic diagram of the circuit, it can be understood that the cathode is a low potential, and there is a resistor R between the low-voltage DC input source (VSS) and the cathode. The magnitude of the resistor R determines the compensation effect of the cathode drop (IR drop). Since the material of the electron transport layer is an electron transport material, which is very different from the energy level of the anode (ITO), and the contact impedance R is very large, so the effect of the cathode IR drop compensation cannot be achieved.

As shown in FIG. 4, where FIG. 4 is a plane view of a conventional auxiliary cathode. The low-voltage DC input source 115 has a plurality of branch traces 110, each branch trace 110 includes a plurality of cathode auxiliary holes 100, and the electron transport layer 115 fills the cathode auxiliary holes 100. The cathode 116 covers the cathode auxiliary holes 100 to form a plane cathode.

SUMMARY OF INVENTION

Technical Problem

The purpose of the present disclosure is to provide an organic light-emitting diode (OLED) structure and a manufacturing method thereof to solve the technical problem that the cathode compensation effect in a pixel circuit existing in the conventional art is poor, resulting in a significant voltage drop.

Technical Solutions

To achieve the above object, the present disclosure provides an OLED structure, including a substrate, a metal layer, a passivation layer, an anode, and an OLED functional layer; wherein the metal layer is disposed on the substrate and is patterned to form a high-voltage direct current (DC) input source and a low-voltage DC input source, and a first through hole is disposed in the metal layer. The passivation layer is disposed on the metal layer and fills in the first through hole, wherein the passivation layer includes a second through hole and a third through hole, the second through hole is disposed opposite to the high-voltage DC input source, and the third through hole is disposed opposite to the low-voltage DC input source. The anode is filled in the second through hole and the third through hole, and a portion of the anode extends to a surface of the passivation layer. The OLED functional layer is disposed on the anode and is disposed opposite to the third through hole.

Furthermore, the OLED functional layer includes a hole injection layer, a hole transport layer, and an electron transport layer, the hole injection layer disposed on the anode and disposed opposite to the third through hole; the hole transport layer disposed on the hole injection layer; and the electron transport layer disposed on the hole transport layer.

Furthermore, the OLED structure further including a cathode and a conductive layer, wherein the cathode is disposed on the OLED functional layer and extends from the OLED functional layer to a surface of the passivation layer corresponding to the first through hole; and the conductive layer covers the cathode and extends from a surface of the cathode to a surface of the anode corresponding to the second through hole.

Furthermore, a PN junction is formed by the cathode, the hole injection layer, the hole transport layer, the electron transport layer, and the anode.

Furthermore, the anode completely fills an inner wall of the third through hole and is connected to the low-voltage DC input source.

Furthermore, the anode completely fills an inner wall of the second through hole and is connected to the high-voltage DC input source.

The present disclosure also provides a method for manufacturing an OLED structure, including the following steps: a metal layer manufacturing step, forming a metal layer on an upper surface of a substrate, wherein the metal layer is patterned to form a high-voltage direct current (DC) input source and an auxiliary cathode, and a first through hole is disposed in the metal layer; a passivation layer manufacturing step, forming a passivation layer on an upper surface of the metal layer, wherein the passivation layer includes a second through hole and a third through hole, and the second through hole is disposed opposite to the high-voltage DC input source and the third through hole is disposed opposite to the low-voltage DC input source; an anode manufacturing step, forming an anode, wherein the anode fills the second through hole and the third through hole, and extends to a surface of the passivation layer; and an OLED functional layer manufacturing step, forming an OLED functional layer on an upper surface of the anode, wherein the OLED functional layer is disposed opposite to the third through hole.

Furthermore, the OLED functional layer manufacturing step includes the following steps: a hole injection layer manufacturing step, forming a hole injection layer on the upper surface of the anode, wherein the hole injection layer is disposed opposite to the third through hole; a hole transport layer manufacturing step, forming a hole transport layer on an upper surface of the hole injection layer; and an electron transport layer manufacturing step, forming an electron transport layer on an upper surface of the hole transport layer.

Furthermore, after the OLED functional layer manufacturing step, the method further includes the following steps: a cathode manufacturing step, forming a cathode on an upper surface of the OLED functional layer, wherein the cathode extends from the OLED functional layer to a surface of the passivation layer corresponding to the first through hole; and a conductive layer manufacturing step, forming a conductive layer, wherein the conductive layer covers the cathode and extends from a surface of the cathode to a surface of the high-voltage DC input source corresponding to the second through hole.

Furthermore, in the anode manufacturing step, the anode is formed by depositing a material of indium tin oxide or indium zinc oxide in the second through hole and the third through hole, and a portion of the anode extends to the surface of the passivation layer.

Beneficial Effect

The technical effect of the present disclosure is to provide an OLED structure and a manufacturing method thereof, which by setting an OLED functional layer to form a PN junction with low impedance. The PN junction and a conductive layer with high impedance constitute a resistive divider, and the PN junction is turned on by adjusting the high-voltage DC input source and low-voltage DC input source. Because the resistance of the PN junction is very small, the potential of the cathode can be approximated to the potential of the low-voltage DC input source according to resistive voltage divider rule, and the low-voltage DC input source uses low-resistance metal, which can effectively avoid the problem of IR drop.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 1:
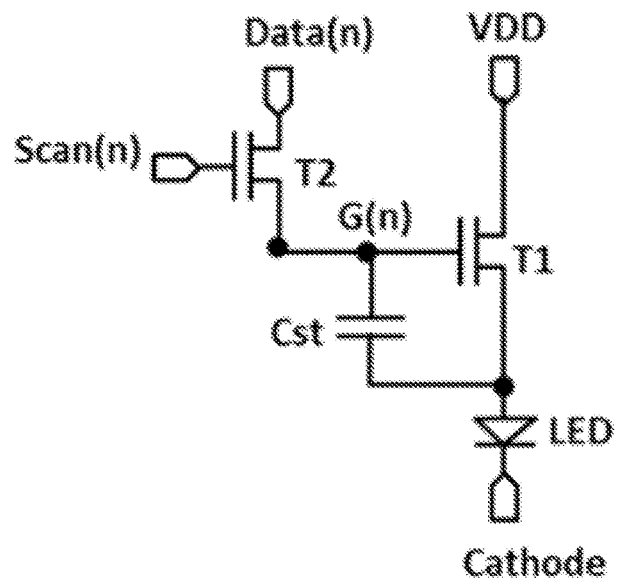
FIG. 1 is a diagram of a 2T1C pixel circuit in a conventional art.
Figure 2:
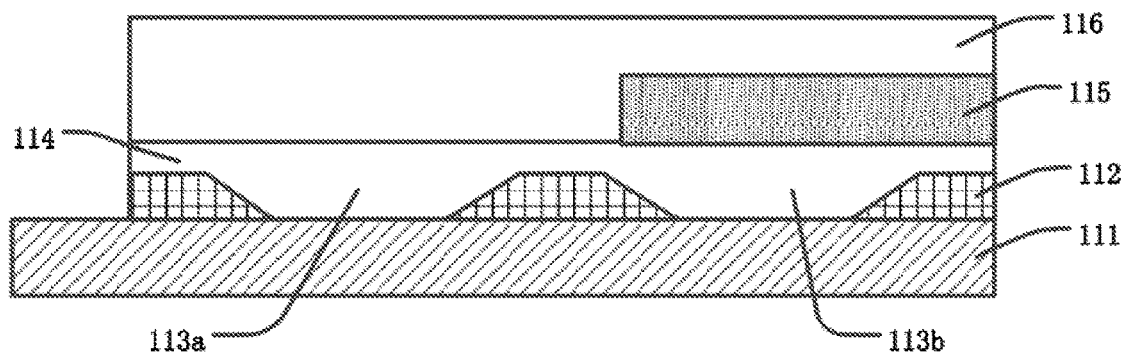
FIG. 2 is a cross-sectional view of an auxiliary cathode in the conventional art.
Figure 3:
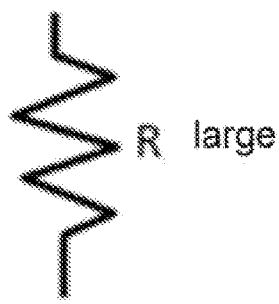
FIG. 3 is an equivalent circuit diagram of FIG. 2.
Figure 4:
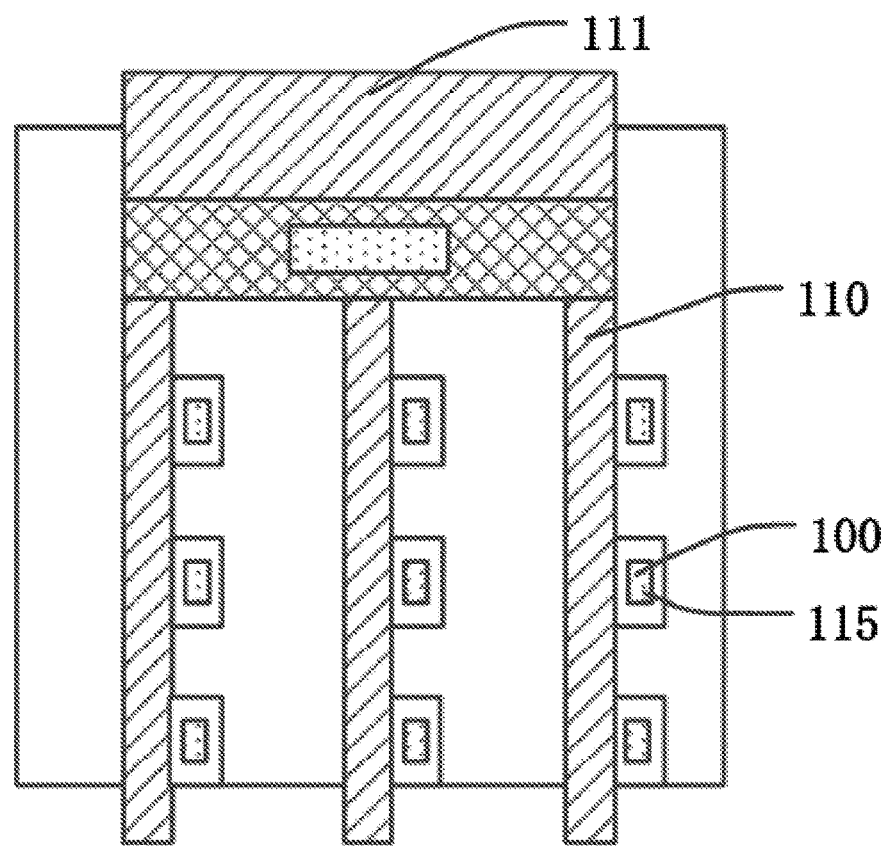
FIG. 4 is a plane view of the auxiliary cathode in the conventional art.

The components in the drawings are identified as follows:

111 low-voltage DC input source, 112 passivation layer, 113a first through hole, 113b second through hole,

114 anode, 115 electron transport layer, 116 cathode, 110 branch trace, 100 cathode auxiliary hole,

1 substrate, 2 metal layer,

3 passivation layer, 4 anode,

5 OLED functional layer, 6 cathode,

7 conductive layer,

21 high-voltage DC input source, 22 low-voltage DC input source, 23 first through hole,

31 second through hole, 32 third through hole,

51 hole injection layer, 52 hole transport layer, 53 electron transport layer,

221 branch trace, and 10 cathode auxiliary hole.

DETAILED DESCRIPTION OF EMBODIMENTS

The following describes the preferred embodiments of the present disclosure with reference to the accompanying drawings of the specification to exemplify that the present disclosure can be implemented. These embodiments can completely introduce the technical content of the present disclosure to those skilled in the art, making the technical content of the present disclosure clearer and easy to understand. However, the present disclosure can be embodied by many different forms of embodiments, and the scope of protection of the present disclosure is not limited to the embodiments mentioned in the text.

Figure 5:
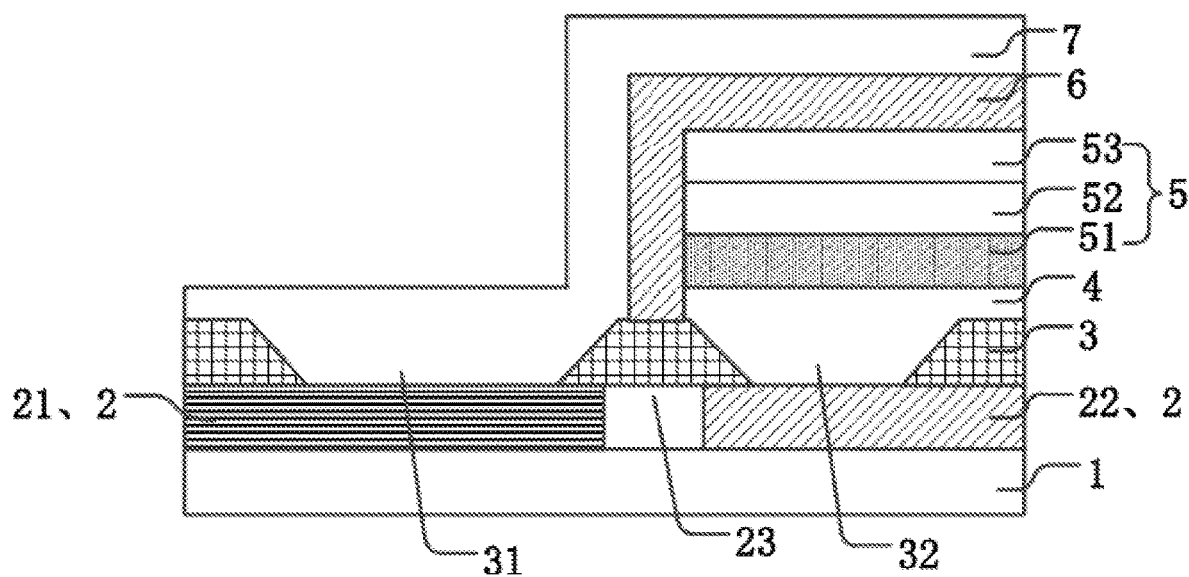
FIG. 5 is a sectional view of an auxiliary cathode according to an embodiment of the present invention.

As shown in FIG. 5, where the present embodiment provides an organic light-emitting diode (OLED) structure including a substrate 1, a metal layer 2, a passivation layer 3, an anode 4, an OLED functional layer 5, a cathode 6, and a conductive layer 7.

The metal layer 2 is disposed on an upper surface of the substrate 1, and is patterned to form a high-voltage DC input source 21 and a low-voltage DC input source 22. A first through hole 23 is disposed in the metal layer 2. The material of the metal layer 2 includes at least one of molybdenum, aluminum, and copper.

The passivation layer 3 is disposed on an upper surface of the metal layer 2 and fills the first through hole 23. The passivation layer 3 includes a second through hole 31 and a third through hole 32. The second through hole 31 is disposed opposite to the high-voltage DC input source 21, and the third through hole 32 is disposed opposite to the low-voltage DC input source 22. The material of the passivation layer 3 includes, but is not limited to, silicon nitride or silicon oxynitride, and has insulating property.

The anode 4 fills the second through hole 31 and the third through hole 32 and partially extends to an upper surface of the passivation layer 3. Specifically, the anode 4 completely fills an inner wall of the second through hole 31, that is, fills a bottom wall and a sidewall of the second through hole 31, and is connected to the high-voltage DC input source 21. The anode 4 also completely fills an inner wall of the third through hole 32, that is, fills a bottom wall and a sidewall of the second through hole 31, and is connected to the low-voltage DC input source 22.

The OLED functional layer 5 is disposed on an upper surface of the anode 4 and is disposed opposite to the third through hole 32. The OLED functional layer 5 includes a hole injection layer 51, a hole transport layer 52, and an electron transport layer 53.

The hole injection layer 51 is disposed on the upper surface of the anode 1 and is opposite to the third through hole 32. The hole transport layer 52 is disposed on an upper surface of the hole injection layer 51. The electron transport layer 53 is disposed on an upper surface of the hole transport layer 52.

The cathode 6 is disposed on an upper surface of the OLED functional layer 5 and extends from the OLED functional layer 5 to the upper surface of the passivation layer 3 corresponding to the first through hole 23.

The conductive layer 7 covers the cathode 6 and extends from the surface of the cathode 6 to an upper surface of the high-voltage DC input source 21 corresponding to the second through hole 31. The conductive layer 7 is a high-impedance conductor.

In the present embodiment, a PN junction is formed by the cathode 6, the hole injection layer 51, the hole transport layer 52, the electron transport layer 53, and the anode 4.

Figure 6:
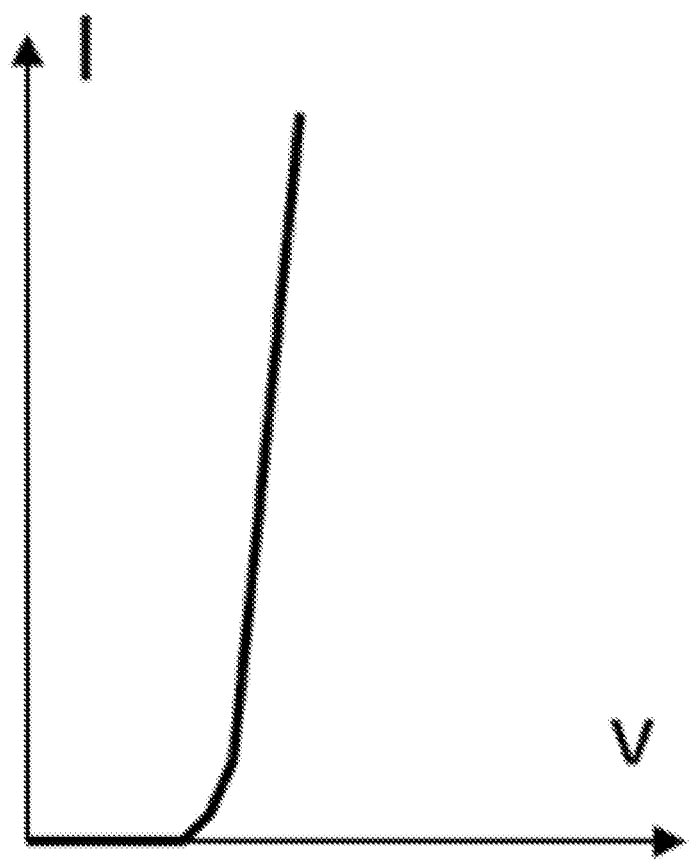
FIG. 6 is a schematic diagram of electrical characteristics of a PN junction according to an embodiment of the present invention.

As shown in FIG. 6, where FIG. 6 is a schematic diagram of electrical characteristics of the PN junction. When the PN junction is conducting in a forward direction, it can be regarded as a resistor with a small impedance.

Figure 7:
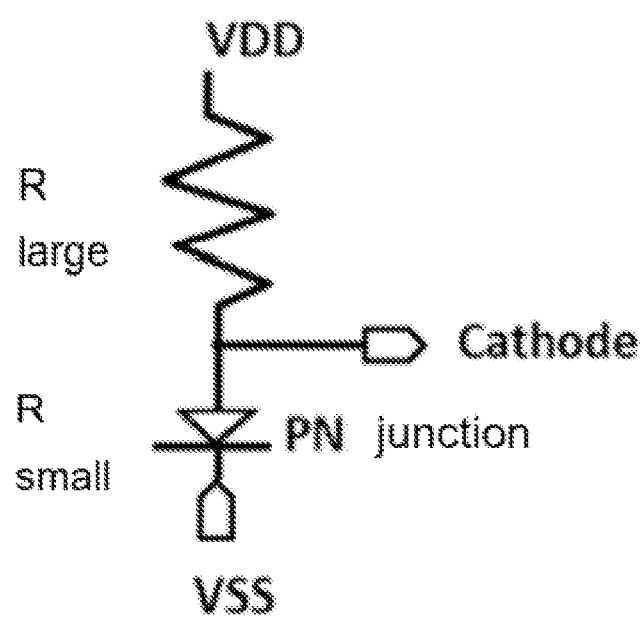
FIG. 7 is an equivalent circuit diagram of FIG. 5 according to the embodiment of the present invention.

As shown in FIG. 7, FIG. 7 is an equivalent circuit diagram of FIG. 5, where the PN junction is a small resistance with a lower impedance, the conductive layer is a large resistance with a higher impedance, and an intermediate node is a cathode potential output terminal. When adjusting the high-voltage DC input source VDD and the low-voltage DC input source VSS, the PN junction is turned on. Because the resistance of the PN junction is very small, the potential of the cathode can be approximated to the potential of the low-voltage DC input source according to resistive voltage divider rule, and the low-voltage DC input source uses low-resistance metal, such as molybdenum, copper, and aluminum, so that the problem of IR drop can be effectively avoided.

Figure 8:
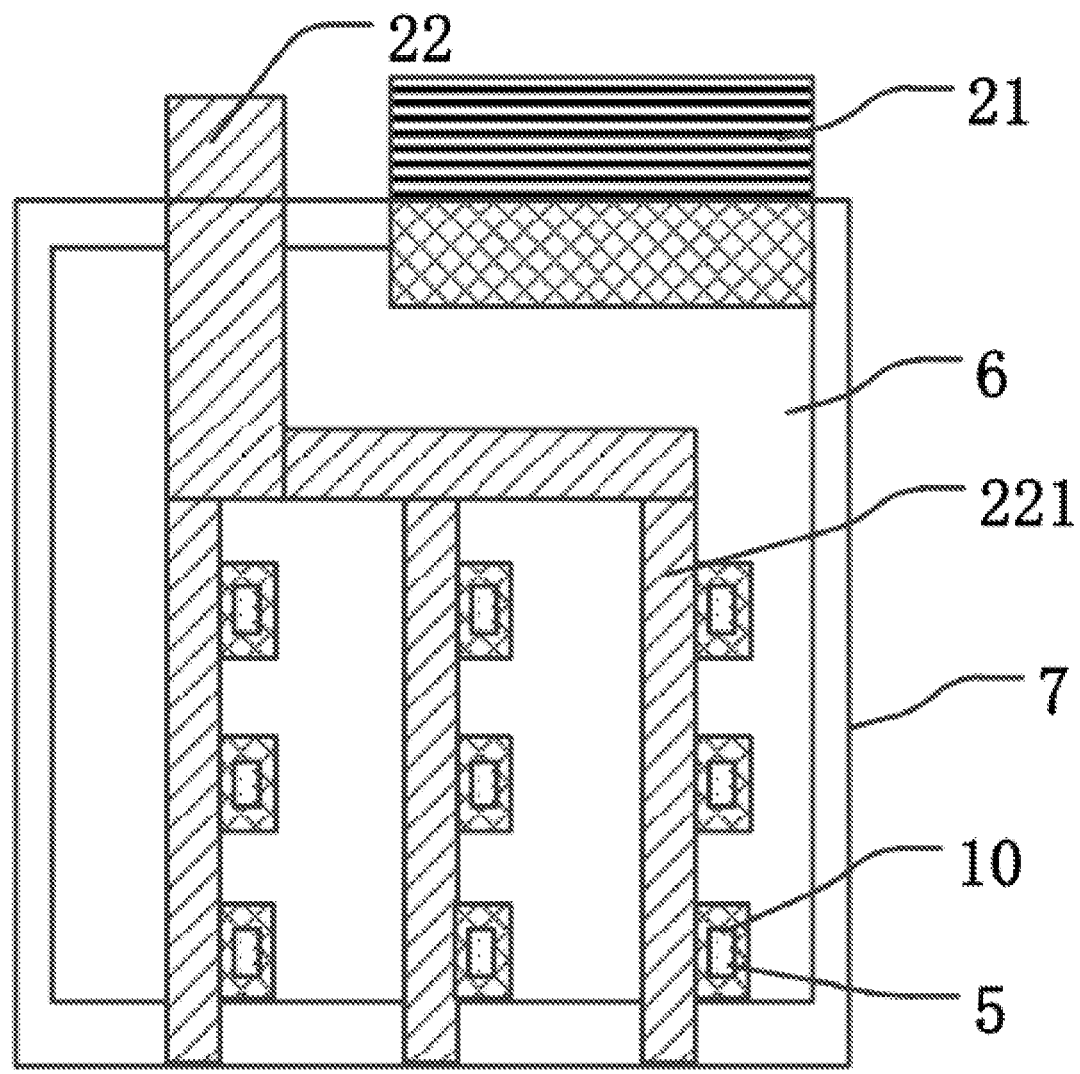
FIG. 8 is a plane view of the auxiliary cathode according to the embodiment of the present invention.

As shown in FIG. 8, where the low-voltage DC input source VSS has a plurality of branch traces 221 on the upper surface of the substrate 1. Each branch trace 221 includes a plurality of cathode auxiliary holes 10, and the OLED functional layer fills the cathode auxiliary holes 10 to form a PN junction. The anode 4 is disposed on the upper surface of the substrate 1 and protrudes from an edge of the substrate 1. The cathode 6 covers the cathode auxiliary holes 10 to form a plane cathode. The conductive layer 7 has a rectangular ring shape, and is disposed on the substrate 1 and a portion of the upper surface of the anode 4, and close to the edge of the substrate 1. The conductive layer 7 is connected to the anode 4.

The technical effect of the present disclosure is to provide an OLED structure and a manufacturing method thereof, which by setting an OLED functional layer to form a PN junction with low impedance. The PN junction and a conductive layer with high impedance constitute a resistive divider, and the PN junction is turned on by adjusting the high-voltage DC input source and low-voltage DC input source. Because the resistance of the PN junction is very small, the potential of the cathode can be approximated to the potential of the low-voltage DC input source according to resistive voltage divider rule, and the low-voltage DC input source uses low-resistance metal, which can effectively avoid the problem of IR drop.

Figure 9:
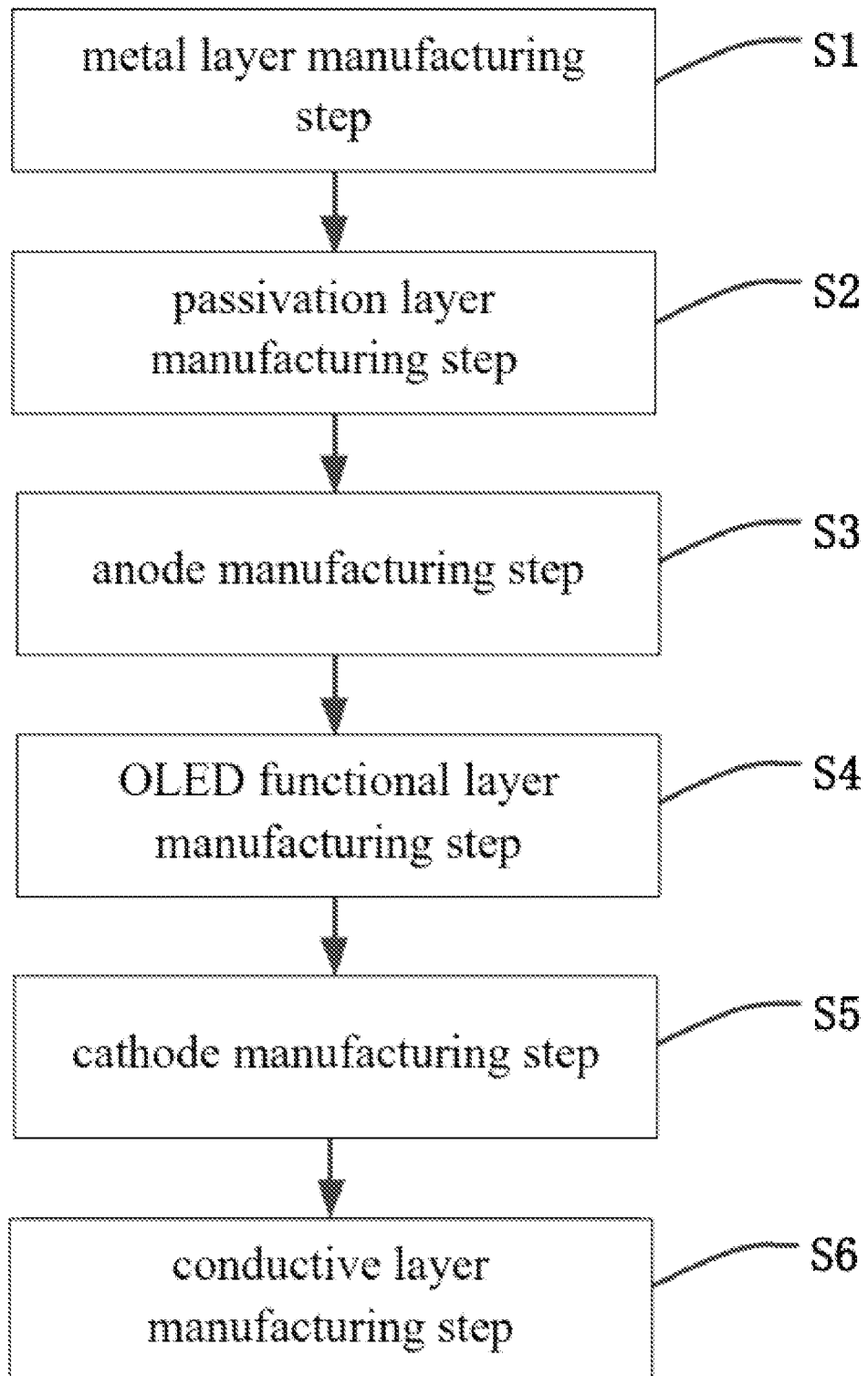
FIG. 9 is a flowchart of a method for manufacturing an organic light-emitting diose (OLED) device structure according to an embodiment of the present invention.

As shown in FIG. 9, the present embodiment further provides a method for manufacturing an OLED structure, which includes the following steps S1 to S8.

S1, a metal layer manufacturing step, forming a metal layer 2 on an upper surface of a substrate, wherein the metal layer 2 is patterned to form a high-voltage direct current (DC) input source 21 and an auxiliary cathode 22, and a first through hole 23 is disposed in the metal layer 2, referring to in FIG. 5.

S2, a passivation layer manufacturing step, forming a passivation layer 3 on an upper surface of the metal layer, wherein the passivation layer 3 includes a second through hole 31 and a third through hole 32, and the second through hole 31 is disposed opposite to the high-voltage DC input source 21 and the third through hole 32 is disposed opposite to the low-voltage DC input source 22. The material of the passivation layer 3 includes, but is not limited to, silicon nitride or silicon oxynitride, and has insulating property. Referring to FIG. 5.

S3, an anode manufacturing step, forming an anode 4, wherein the anode 1 fills the second through hole 31 and the third through hole 32, and extends to a surface of the passivation layer 3. The anode 4 is formed by depositing a material of indium tin oxide or indium zinc oxide in the second through hole 31 and the third through hole 32, and a portion of the anode 4 extends to the surface of the passivation layer, referring to FIG. 5.

S4, an OLED functional layer manufacturing step, forming an OLED functional layer 5 on an upper surface of the anode 4, wherein the OLED functional layer 5 is disposed opposite to the third through hole 32, referring to FIG. 5.

Figure 10:
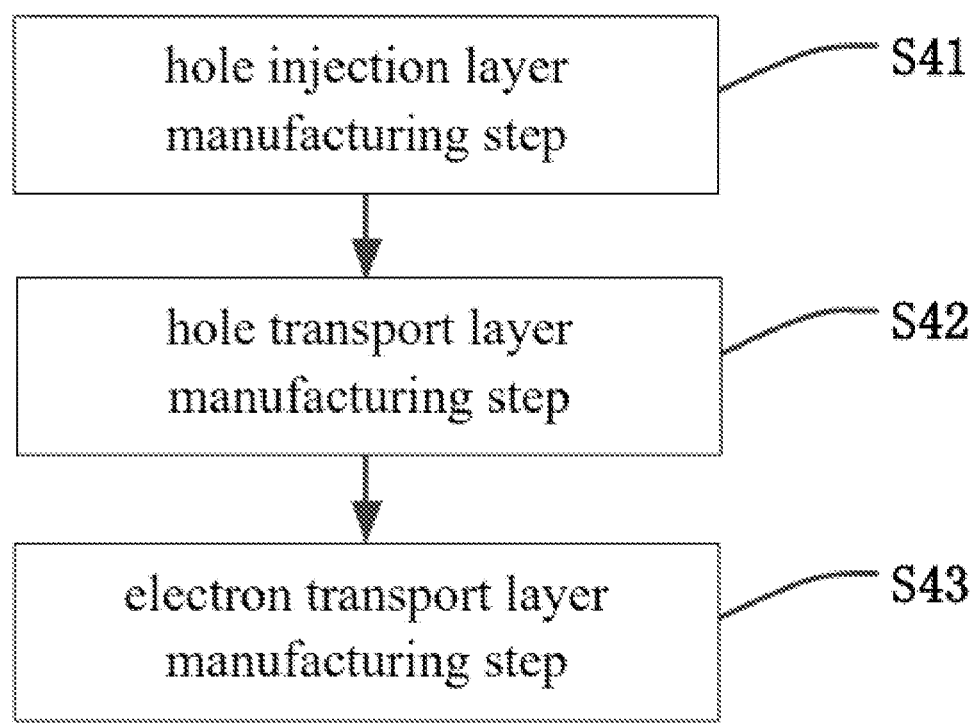
FIG. 10 is a flowchart of manufacturing an OLED functional layer according to an embodiment of the present invention.

As shown in FIG. 10, where the OLED functional layer manufacturing step includes the following steps S41 to S42. S41, a hole injection layer manufacturing step, forming a hole injection layer on the upper surface of the anode, wherein the hole injection layer is disposed opposite to the third through hole. S42, a hole transport layer manufacturing step, forming a hole transport layer on an upper surface of the hole injection layer. And, S43, an electron transport layer manufacturing step, forming an electron transport layer on an upper surface of the hole transport layer.

S5, a cathode manufacturing step, forming a cathode 6 on an upper surface of the OLED functional layer 5, wherein the cathode 6 extends from the OLED functional layer 5 to a surface of the passivation layer 3 corresponding to the first through hole 23, referring to FIG. 5. Specifically, the cathode is disposed on an upper surface of the electron transport layer, and extends from the electron transport layer to the upper surface of the passivation layer corresponding to the first through hole.

S6, a conductive layer manufacturing step, forming a conductive layer 7, wherein the conductive layer 7 covers the cathode 6 and extends from a surface of the cathode 6 to the surface of the anode 4 corresponding to the second through hole 31, referring to FIG. 5.

The present disclosure provides an OLED structure and a manufacturing method thereof. An OLED functional layer forms a PN junction with low impedance. The PN junction with low impedance and a conductive layer with high impedance together constitute a resistive voltage divider. The PN junction is turned on by adjusting the high-voltage DC input source and the low-voltage DC input source. Because the resistance of the PN junction is very low, the potential of the cathode can be approximated to the potential of the low-voltage DC input source according to resistive voltage divider rule. In addition to that, the low-voltage DC input source uses low-resistance metal. Accordingly, the present disclosure can effectively prevent the IR drop problem.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode (OLED) structure, comprising:
   a substrate;
   a metal layer disposed on the substrate and patterned to form a high-voltage direct current (DC) input source and a low-voltage DC input source, wherein a first through hole is defined in the metal layer;
   a passivation layer disposed on the metal layer and filled in the first through hole, wherein the passivation layer comprises a second through hole and a third through hole, the second through hole is defined corresponding to the high-voltage DC input source, and the third through hole is defined corresponding to the low-voltage DC input source;
   an anode filled in the second through hole and the third through hole, a portion of the anode extending to a surface of the passivation layer;
   an OLED functional layer disposed on the anode and disposed opposite to the third through hole, wherein the OLED functional layer comprises:
      a hole injection layer disposed on the anode and disposed opposite to the third through hole;
      a hole transport layer disposed on the hole injection layer; and
      an electron transport layer disposed on the hole transport layer;
   a cathode disposed on the OLED functional layer, wherein the cathode extends from the OLED functional layer to a surface of the passivation layer corresponding to the first through hole; and
   a conductive layer, wherein the conductive layer covers the cathode and extends from a surface of the cathode to a surface of the anode corresponding to the second through hole;
   wherein the cathode, the hole injection layer, the hole transport layer, the electron transport layer, and the anode together constitute a PN junction.

2. The OLED structure according to claim 1, wherein the anode completely fills the third through hole and is connected to the low-voltage DC input source.

3. The OLED structure according to claim 1, wherein the anode completely fills the second through hole and is connected to the high-voltage DC input source.

4. A method for manufacturing an organic light-emitting diode (OLED) structure, comprising the following steps:
   a metal layer manufacturing step of forming a metal layer on an upper surface of a substrate, wherein the metal layer is patterned to form a high-voltage direct current (DC) input source and a low-voltage DC input source, and a first through hole is formed in the metal layer;
   a passivation layer manufacturing step of forming a passivation layer on an upper surface of the metal layer, wherein the passivation layer comprises a second through hole and a third through hole, and the second through hole is formed in a position corresponding to the high-voltage DC input source and the third through hole is formed in a position corresponding to the low-voltage DC input source;
   an anode manufacturing step of forming an anode, wherein the anode fills the second through hole and the third through hole, and extends to a surface of the passivation layer; and
   an OLED functional layer manufacturing step of forming an OLED functional layer on an upper surface of the anode, wherein the OLED functional layer is disposed corresponding to the third through hole, and the OLED functional layer manufacturing step further comprises the following steps:
      a hole injection layer manufacturing step of forming a hole injection layer on the upper surface of the anode, wherein the hole injection layer is disposed corresponding to the third through hole;
      a hole transport layer manufacturing step of forming a hole transport layer on an upper surface of the hole injection layer; and
      an electron transport layer manufacturing step of forming an electron transport layer on an upper surface of the hole transport layer;
   a cathode manufacturing step of forming a cathode on an upper surface of the OLED functional layer, wherein the cathode extends from the OLED functional layer to a surface of the passivation layer corresponding to the first through hole; and
   a conductive layer manufacturing step of forming a conductive layer, wherein the conductive layer covers the cathode and extends from a surface of the cathode to a surface of the high-voltage DC input source corresponding to the second through hole;
   wherein the cathode, the hole injection layer, the hole transport layer, the electron transport layer, and the anode together constitute a PN junction.

5. The method for manufacturing the OLED structure according to claim 4, wherein in the anode manufacturing step, the anode is formed by depositing a material of indium tin oxide or indium zinc oxide in the second through hole and the third through hole, and a portion of the anode extends to the surface of the passivation layer.

* * * * *